United States Patent
Pineda de Gyvez et al.

(10) Patent No.: US 8,302,059 B2
(45) Date of Patent: Oct. 30, 2012

(54) POWER SWITCH DESIGN METHOD AND PROGRAM

(75) Inventors: Jose de Jesus Pineda de Gyvez, Eindhoven (NL); Rinze Ida Mechtildis Peter Meijer, Herkenbosch (NL); Cas Groot, Antwerp (BE)

(73) Assignee: NXP B.V., Eindhoven (NL)

( * ) Notice: Subject to any disclaimer, the term of this patent is extended or adjusted under 35 U.S.C. 154(b) by 56 days.

(21) Appl. No.: 12/994,508

(22) PCT Filed: May 25, 2009

(86) PCT No.: PCT/IB2009/052181
§ 371 (c)(1),
(2), (4) Date: Nov. 24, 2010

(87) PCT Pub. No.: WO2009/144658
PCT Pub. Date: Dec. 3, 2009

(65) Prior Publication Data
US 2011/0083116 A1    Apr. 7, 2011

(30) Foreign Application Priority Data

May 27, 2008    (EP) ..................................... 08104100

(51) Int. Cl.
*G06F 17/50* (2006.01)
(52) U.S. Cl. ........................ 716/122; 716/135
(58) Field of Classification Search .......... 716/118–119, 716/122, 132, 135
See application file for complete search history.

(56) References Cited

U.S. PATENT DOCUMENTS

| | | | | |
|---|---|---|---|---|
| 5,675,501 A * | 10/1997 | Aoki | .............................. | 716/122 |
| 7,340,708 B2 * | 3/2008 | Hamazaki | ..................... | 716/119 |
| 7,543,262 B2 * | 6/2009 | Wang et al. | ..................... | 716/119 |
| 7,707,521 B2 * | 4/2010 | Tsai et al. | ....................... | 716/120 |
| 7,966,596 B2 * | 6/2011 | Lu et al. | ......................... | 716/119 |
| 2003/0140323 A1 * | 7/2003 | Dono | ............................... | 716/5 |
| 2006/0271903 A1 * | 11/2006 | Hamazaki | ........................ | 716/17 |
| 2007/0130553 A1 * | 6/2007 | Wang et al. | ..................... | 716/11 |
| 2007/0290270 A1 * | 12/2007 | Ko et al. | ......................... | 257/369 |

(Continued)

OTHER PUBLICATIONS

Mutoh, S., et al "1-V Power Supply High-Speed Digital Circuit Technology with Multithreshold Voltage CMOS", IEEE J. of Solid-State Circuits, vol. 30, No. 8, pp. 847-854 (Aug. 1995).

(Continued)

*Primary Examiner* — Stacy Whitmore

(57) ABSTRACT

A method of designing a power switch block (200) for an integrated circuit layout in a predefined integrated circuit technology is disclosed. The power switch block (200) includes a segment (710) comprising a plurality of spaced parallel conductors (110, 120, 130, 140) each having a predefined height in said technology, a stack of a first power switch (115) of a first conductivity type and a pair of drivers (152; 154) for respectively driving the first power switch (115) and a second power switch (135), said drivers having predefined dimensions in said technology, and the second switch (135) of a second conductivity type. The method comprises providing respective predefined width/length ratios for said power switches (115; 135); determining a total height of the segment (710) from the sum of the predefined heights of the individual conductors (110; 120; 130; 140) and respective spacings (310; 320) between said individual conductors, determining the height of the first transistor (115) from the difference between the total height and the predefined driver height; determining the width of the first transistor (115) from the combined predefined widths of the pair of drivers (152; 154); optimizing the first power switch layout within its determined height and width based on its predefined width/length ratio; and optimizing the second power switch layout based on its predefined width/height ratio.

20 Claims, 7 Drawing Sheets

U.S. PATENT DOCUMENTS

| | | | |
|---|---|---|---|
| 2010/0058267 A1* | 3/2010 | Lu et al. | 716/9 |
| 2010/0095253 A1* | 4/2010 | Hou et al. | 716/2 |
| 2010/0287518 A1* | 11/2010 | Becker | 716/9 |
| 2011/0289466 A1* | 11/2011 | Hou et al. | 716/119 |

OTHER PUBLICATIONS

Calimera, A., et al "Design of a Family of Sleep Transistor Cells for a Clustered Power-Gating Flow in 65nm Technology", Proc. of the ACM Great Lakes Symp. on VLSI, pp. 501-504 (2007).

Kao, J., et al "Transistor Sizing Issues and Tool for Multi-Threshold CMOS Technology", Proc. of the Design Automation Conf., vol. Conf. 34, pp. 409-414 (Jun. 1997).

Shi, K. et al "Sleep Transistor Design and Implementation—Simple Concepts Yet Challenges to Be Optimum", IEEE 2006 International Symposium on VLSI Design, Automation and Test, pp. 1-4 (Apr. 2006).

International Search Report and Written Opinion for Int'l. patent appln. No. PCT/IB2009/052181 (Nov. 11, 2009).

* cited by examiner

POWER SWITCH DESIGN METHOD AND PROGRAM

FIELD OF THE INVENTION

The present invention relates to a method of designing a power switch block for an integrated circuit layout in a predefined integrated circuit technology.

The present invention further related to a computer program product implementing such a method.

BACKGROUND OF THE INVENTION

Nowadays, many integrated circuits (ICs) are designed to perform a wide variety of computational tasks. To this end, such an IC may comprise a plurality of different circuit portions, e.g. cores, each designed to perform one of said computational tasks. An example of such a multi-tasking IC design is the system-on-chip concept. Usually, such ICs perform only a subset of the computational tasks at the same time, which means that the other circuit portions do not perform any tasks. To avoid unnecessary power consumption by such idle circuit portions, these circuit portions are temporarily disconnected from the power supply until their functionality is required again.

There are several IC design principles available to facilitate disconnecting a circuit portion from its power supply. FIG. 1 shows such a principle. A core 100 has internal power lines 130 and 140, i.e. a virtual ground and a virtual supply line. The virtual supply 130 is connected to a supply line 110 via a pMOS power switch 115 for gating the power supply line 110, e.g. $V_{DD}$, and the virtual ground line 140 is connected to a ground line 120 via an nMOS power switch 135 for gating the ground line 120, e.g. $V_{SS}$. An inverter chain 150 comprises a first inverter 152 for controlling the nMOS power switch 135 and a second inverter 154 for controlling the pMOS power switch 115.

As shown in FIG. 2, which shows a possible layout of a power switch block 200, the power switch block typically comprises a number of segments 220, with each segment comprising a pair of power switches 115, 135 and a pair of drivers for the power switches, e.g. inverters 152 and 154. The number of segments is typically governed by performance requirements such as the maximum allowable resistance of the power switches in the power switch block 200.

Currently, the power switch block 200 is designed based on the aforementioned performance requirements using standard library segment components, such as the use of a standard transistor as a power switch. Such a standard transistor usually has a ratio of its gate width and gate length (hereafter referred to as the width/length ratio) that is relatively small, which means that such a transistor has a relatively high resistance. Thus, in order to meet the performance requirements of a power switch, which may include a maximum allowable resistance, a maximum allowable latency to reach a full power-up or power-down and so on, the power switch block 200 typically must contain a large number of segments 220 to comply with such performance requirements. This not only adds area overhead but also complexity to the IC design because a substantial number of interconnections has to be provided for. In addition, the use of standard transistors may make it difficult to accurately meet the performance requirements.

SUMMARY OF THE INVENTION

The present invention seeks to provide a method for designing a power switch block in which at least some of the aforementioned disadvantages are overcome.

The present invention seeks to provide a computer program for implementing the inventive method for designing a power switch block.

According to a first aspect, there is provided a method of designing a power switch block for an integrated circuit layout in a predefined integrated circuit technology, the power switch block including a segment comprising a plurality of spaced parallel conductors each having a predefined height in said technology, a stack of a first power switch of a first conductivity type and a pair of drivers for respectively driving the first power switch and a second power switch, said drivers having predefined dimensions in said technology, and the second switch of a second conductivity type, the method comprising providing respective predefined width/length ratios for said power switches; determining a total height of the segment from the sum of the predefined heights of the individual conductors and respective spacings between said individual conductors, determining the height of the first transistor from the difference between the total height and the predefined driver height; determining the width of the first transistor from the combined predefined widths of the pair of drivers; optimizing the first power switch layout within its determined height and width based on its predefined width/length ratio; and optimizing the second power switch layout based on its predefined width/height ratio.

By providing a stack of the drivers and a small power switch in combination with optimizing the layout of the power switches instead of using standard switches from a predefined library, a highly area-efficient power supply block is obtained. Moreover, the optimization of the power switch layout allows for an accurate compliance of the power switch block with its performance requirements.

Preferably, the step of optimizing the first power switch layout comprises optimizing at least one of the gate length and the number of fingers of the first power switch such that a difference between the optimized width/length ratio of the first power switch and the predefined width/length ratio is minimized.

In an embodiment, the method further comprises comparing the optimized width/length ratio of the first power switch with the predefined width/length ratio, and in case the optimized width/length ratio of the first power switch is smaller than the predefined width/length ratio, adding a further power switch of the first conductivity type to the segment, said further switch having a width/length ratio such that a difference between the effective width/length ratio of the combined first and further power switches and the predefined width/length ratio is minimized.

This way, the area of the power switch block is only increased once it becomes apparent that the first power switch, which typically has a smaller height that the further power switch, is incapable of meeting the performance requirements of the power switch block. The difference between effective width/height ratio and the predefined width/height ratio may be minimized by optimizing at least one of the gate width and the number of fingers of the further power switch.

Preferably, the step of optimizing the first power switch layout may comprise defining the number of fingers of the first power switch to one less than the maximum number of fingers available for the first power switch in the predefined integrated circuit technology in case the predefined width/length ratio of the first power switch exceeds the maximum possible width/length ratio of the first power switch by less than a predefined amount.

In an embodiment, the step of optimizing the second power switch layout comprises optimizing at least one of the gate length, gate width and the number of fingers of the second power switch. This ensures that the second power switch will have a width/length ratio that closely resembles its predefined width/length ratio.

In a further embodiment, the method further comprises providing a library of components in the predefined integrated circuit technology, said library including a plurality of drivers having different capacitive driving capabilities; and selecting the pair of drivers from said library based on the respective loads of the first power switch and the second power switch. This way, it is ensured that the area overhead is minimized by ensuring that the smallest possible driver is selected.

Advantageously, the further embodiment further comprises finding, in said library, the driver having the highest capacitive driving capacity; comparing said driving capacity with the load of the corresponding power switch; and, in case the load exceeds said driving capacity, adding a further segment to the power switch block; and dividing said load over the segment and the further segment. This has the advantage that it can be determined early on in the design process how many segments are required in the power switch block, thus enabling an area-efficient design of each segment. Typically, because the overall load is balanced over the segments, these segments are substantially identical to each other.

In another embodiment, the predefined width/length ratios are calculated from the desired respective resistances of said power switches. This ensures a good match between the desired performance properties of the power switch block and its actual performance properties following the layout optimization of the respective power switches.

According to another aspect of the present invention, there is provided a computer program product comprising computer code means arranged to, when executed on a computer, implement the steps of the method according to the present invention. Such computer code means, which may comprise algorithms and instructions to implement the method of the present invention, has the advantage that an IC design comprising area-optimized power switch blocks can be automatically provided. Such a program product may be stored on a computer-readable data carrier such as a DVD, a CD-ROM, a memory stick, an internet-accessible hard disk and so on.

BRIEF DESCRIPTION OF THE DRAWINGS

Embodiments of the invention are described in more detail and by way of non-limiting examples with reference to the accompanying drawings, wherein.

DETAILED DESCRIPTION OF EMBODIMENTS

Figure 1:
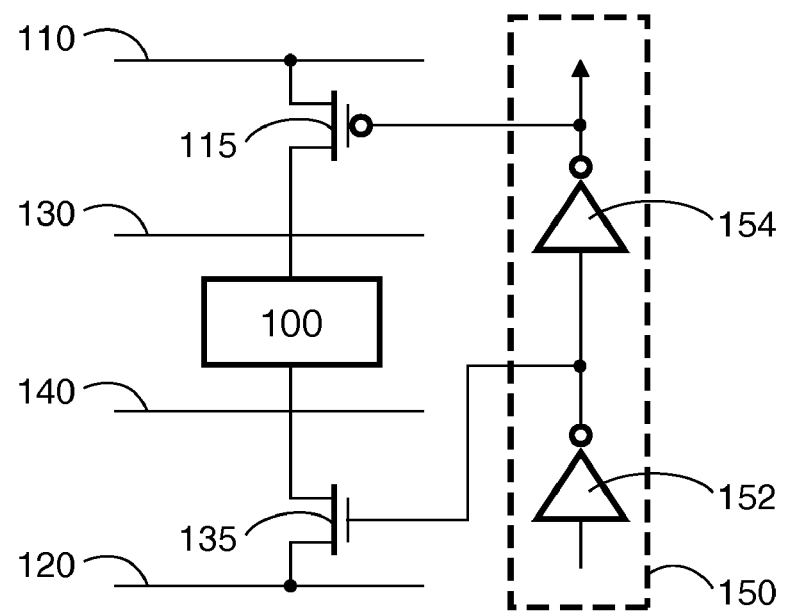
FIG. 1 shows a part of an IC.

It should be understood that the Figures are merely schematic and are not drawn to scale. It should also be understood that the same reference numerals are used throughout the Figures to indicate the same or similar parts.

In accordance with the method of the present invention, the dimension of the power switch block 200 is designed in such a way that the total area covered by the power switch block 200 is minimized. The method of the present invention is based on the realization that for a given IC technology, although the various components of the power switch block 200 may have dimensions that are more or less fixed within the given IC technology, the layout of some components, such as the first power switch 115 and the second power switch 135 may be optimized within the dimensions constraints to optimize the performance of such a component within the power switch block 200. In other words, some components are designed on-the-fly instead of taken from a standard library to optimize the performance of these components. This is particularly applicable to the power switches 115 and 135, because different performance requirements of the power switch block 200 typically directly affects the performance requirements of these switches.

The method of the present invention may be applied to any suitable IC technology in which power switches, e.g. transistors, of opposite conductivity type are used. However, for reasons of brevity, the remainder of this description will be limited to CMOS technology, in which the first power switch 115 is a pMOS switch, and in which the second power switch 135 is an nMOS switch.

Figure 3:
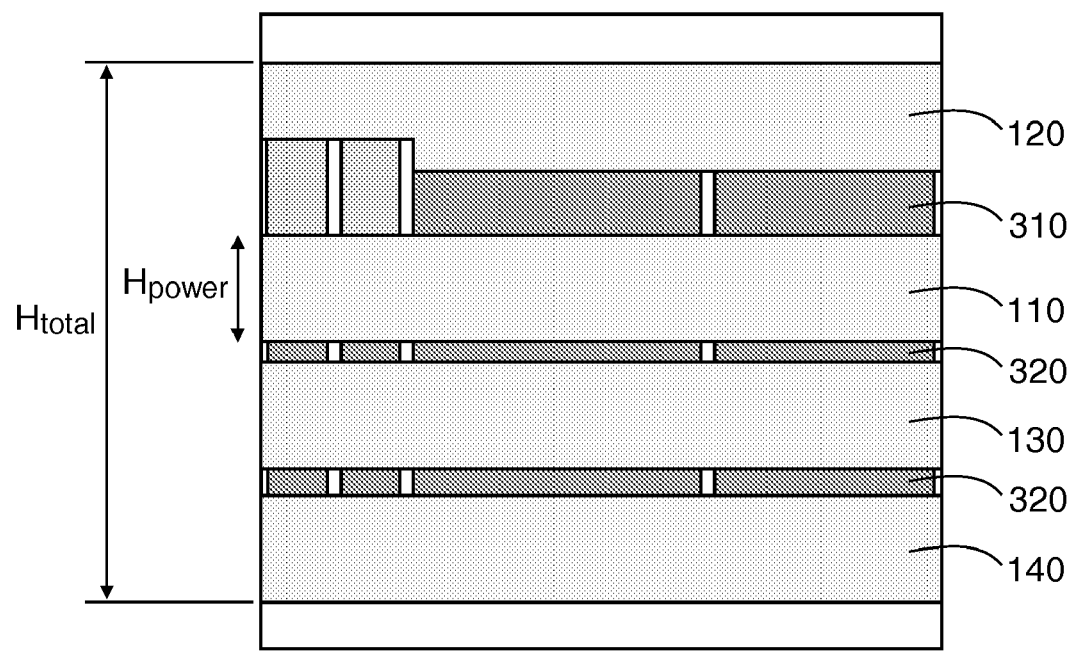
FIG. 3 shows a layout of a power switch block of the present invention from a power perspective.

In case of the power switch block 200 being composed of a NMOS and PMOS switch, the power grid of the power switch block 200 typically requires four power strips. A layout of these power strips is shown in FIG. 3. The power strips in FIG. 3 correspond with the power supply lines shown in FIG. 1. In an embodiment, the four power strips are placed to maintain the largest possible width $H_{power}$, thus optimizing the capacity of these power strips.

The ground strip 120 and the $V_{DD}$ strip 110 are spaced apart by a distance $H_{routing.channel}$, which is a space required for the placement and routing of the drivers 152 and 154. The other strips are spaced apart by a distance $H_{drc.height}$, which is at least the minimum distance required by the technology design rule check (DRC). Hence, the minimum total height $H_{total}$ of the power supply block 200 may be defined as:

$$H_{total}=4 \cdot H_{power}+2 \cdot H_{drc.height}+H_{routing.channel} \quad (1)$$

In 65 nm CMOS technology, the height of each power strip is approximately 1.4 μm. Adding the DRC height and the routing channel height to the total power strip height, results in a total height of the power switch block 200 of approximately 8 μm in CMOS 065.

Figure 4:
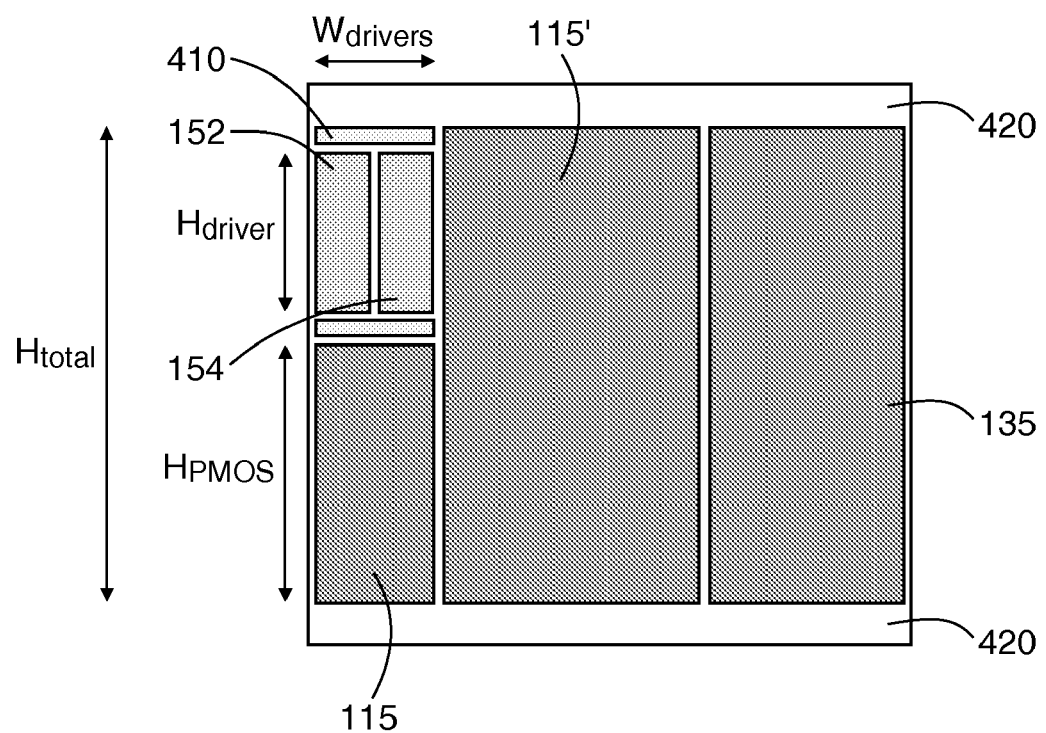
FIG. 4 shows a layout of a power switch block of the present invention from a functionality perspective.

Hence, the functional content of the power supply block 200 must be mapped onto the total height as defined by equation (1). FIG. 4 depicts a preferred embodiment of a functional layout of the power block supply 200. In this layout, three column-based modules can be recognized. The first module comprises a stack of the pair of drivers 152, 154 and the pMOS switch 115. The first module may further comprise latch-up protection spacings 410 surrounding the driver pair 152, 154.

The second module, which is an optional module as will be explained in more detail later, comprises a further pMOS switch 115', which has a height that is substantially identical to the total height of the power switch block 200.

The third module comprises the nMOS transistor 135, which also has a height that is substantially identical to the total height of the power switch block 200. In the context of the present invention, 'substantially identical' is intended to indicate that the height of these switches are preferably the same as the total height of the power supply block 200, but may be slightly smaller, e.g. no more than 10% smaller.

The drivers 152 and 154, are typically selected from a standard library for the predefined IC technology, such as CMOS065. The drivers 152 and 154 are selected based on the performance requirements of the power switches 115 and 135, as will be explained in more detail later. Consequently, the width $W_{drivers}$ of the driver pair and the height $H_{driver}$ of each driver will depend on which driver is selected from the standard library.

Since the total height of the power switch block 200 is known from equation (1), the height $H_{PMOS}$ of the small PMOS power switch 115 in the first module can be defined as follows:

$$H_{total}=H_{driver}+H_{PMOS}+2\cdot H_{latch} \quad (2)$$

Wherein $H_{latch}$ is the height of the latch-up protection spacing 410. This height is typically governed by the DRC requirements of the specified IC technology. The driver height is governed by the dimensions of the selected standard library cells.

Solving equation (2) gives the maximum available height for the small PMOS power switch 115. The width of the small PMOS power switch 115 preferably is equal to twice the size of the drivers 152, 154 to efficiently fill the area in the first module below the drivers 152, 154.

As previously mentioned, the layout of the pMOS power switch 115 and nMOS power switch 135 are optimized based on specified performance requirements of these power switches. Preferably, these performance requirements are specified in terms of a required width/length (W/L) ratio for these power switches. To achieve a power switch layout that meets its required W/L ratio, variables such as gate length, gate width and number of transistor fingers may be varied. These variables typically have an upper and/or a lower bound in the predefined IC technology. For instance, the maximum amount of fingers of a pMOS transistor is typically limited by the design rule of the used technology.

Generally, a PMOS transistor approximately covers twice the area of an nMOS transistor because electrons move more easily than holes do.

Therefore, in case of a high required W/L ratio for the pMOS power switch 115, this switch may be mapped to reduce the total switch area by two adjacent transistors, i.e. a 'small' pMOS transistor 115 and a 'large' pMOS transistor 115', which are typically controlled by the same driver.

Figure 5:
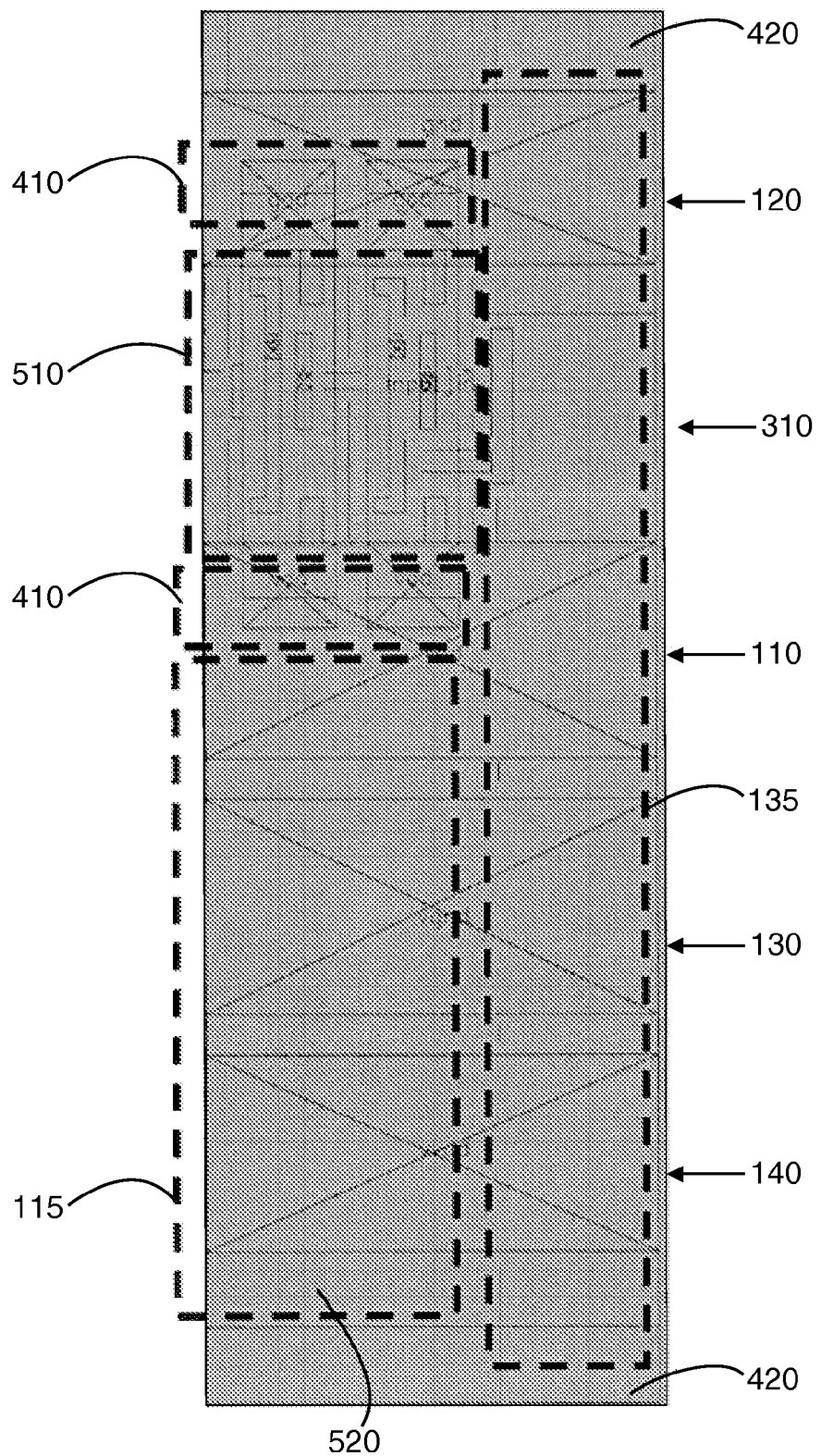
FIG. 5 shows a flowchart of an aspect of the method of the present invention.

In case of a relatively modest required W/L ratio, the larger pMOS transistor 115' may be omitted, with the gate length and/or the number of fingers of the small pMOS transistor 115 being adapted to achieve the required W/L ratio. The layout of the small pMOS transistor 115 is limited to a maximum amount of fingers to match the desired W/L ratio. This amount is governed by the $W_{drivers}$, i.e. the combined width of the driver pair above the small pMOS transistor 115 in the first module. For instance, in 65 nm CMOS technology the maximum amount of fingers is typically limited to 5. FIG. 5 shows an example of a power supply block 200 having only a small pMOS transistor as first power switch 115. The small pMOS transistor 115 is located under block 510 comprising the driver pair and the latch-up protection spacing 410. The block 510 is placed in the routing spacing 310. The pMOS transistor 115 comprises three fingers 520.

Figure 6:
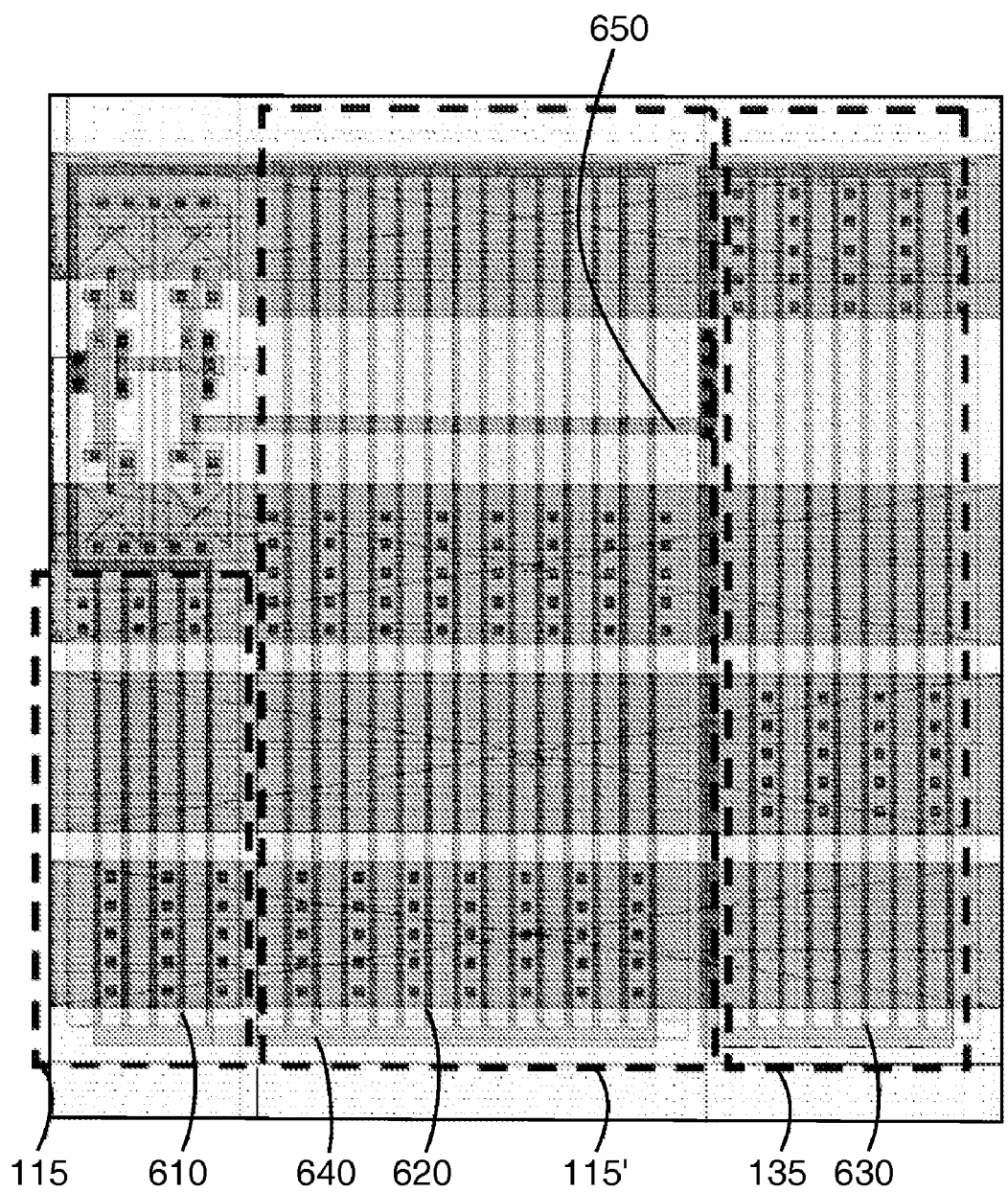
FIG. 6 shows a flowchart of another aspect of the method of the present invention.

In a preferred embodiment, in case the large pMOS transistor 115' is also required, this transistor is adapted to have a number of fingers and a gate width to achieve the remaining W/L ratio, i.e. the difference between the required W/L ratio and the maximum W/L ratio of the small pMOS transistor 115. It will be appreciated that the gate length of the large pMOS transistor preferably is kept constant to utilize the height available to this transistor. An embodiment of a power switch block also comprising the large pMOS transistor is shown in FIG. 6. The small pMOS transistor 115 comprises five fingers 610 and the large pMOS transistor 115' comprises 14 fingers 620. The nMOS transistor 135 comprises 8 fingers 630. The pMOS transistors 115 and 115' are connected to one of the drivers by control line 640, whereas the nMOS transistor 135 is connected to the other driver by control line 650.

Preferably, when the W/L ratio of the pMOS transistor 115 is low, a low amount of fingers is applied in the large PMOS transistor 115' because this reduces the required number of contacts to a power line can be lower to reduce the minimum gate width. Hence, in this embodiment, adjustment of the gate width is preferred over adjustment of the number of fingers. This further has the advantage that the introduction of a gap between the required and actual W/L ratio by placing an extra finger, thus causing a large increase step in the W/L ratio, is avoided. For example, in CMOS 065 (i.e. a 65 nm CMOS technology), the layout boundaries of the gate width can vary from 3.87 µm to 7.34 µm when using less than 3 fingers or from 4.65 µm to 7.34 µm when using more than 3 fingers.

In an embodiment, when the required pMOS power switch W/L ratio is slightly larger than the maximum capable W/L ratio of the small PMOS transistor 115, the small PMOS transistor 115 is composed of the maximum amount of fingers minus one, with the larger PMOS having 1 finger with the smallest possible gate length to ensure a smooth transition of the W/L ratios of only the small PMOS transistor 115 and the combination of the small and large PMOS transistors 115 and 115'.

The power switch block 200 typically comprises of a single NMOS transistor 135 per segment. This transistor is located next to the large PMOS transistor 115 or next to the small pMOS transistor 115' in case of the absence of the large pMOS transistor. The layout of the NMOS transistor 135 is also optimized based on a required W/L ratio for this transistor. The required W/L ratio may be matched altering the number of fingers, the gate width, and/or the gate length of the nMOS transistor 135.

For instance, in 65 nm CMOS, the width of the gate may be varied between 5.6 µm and 7.34 µm. The lower limit is imposed by the distance between the $V_{DD}$ power line 110 and the virtual ground line 130. Typically, the gate length of the nMOS transistor 135 is only changed if the number of fingers is less than a certain quantity. This quantity is dependent on the technology selected and is chosen to ensure a smooth transition between discrete values of the W/L ratio when switching to a higher number of fingers.

In 65 nm CMOS, the optimal number to maintain the smallest area coverage by the nMOS transistor 135 whilst maintaining a smooth transition is 5 fingers. Since the NMOS power switch 135 and the PMOS power switch 115 both have their own power switch driver, the maximum W/L ratio of these switches will be similar. Since the PMOS is always larger, when assuming equal resistance for the NMOS and PMOS, the PMOS is the dominant factor in determining the maximum W/L ratio and hence the power switch driver, as will be explained in more detail below.

The number of fingers of the large PMOS transistor 115' can vary between 0, in which case the large PMOS transistor 115' is absent, to an upper limit which is determined by the maximum capacitive load of the corresponding power switch driver. Hence, the maximum achievable W/L ratio of the pMOS and nMOS transistors is capped by the power switch driver having the maximum available capacitive load in the technology library.

For instance, in a CMOS 065 library, the largest power switch driver of a compatible width, an IVX9 inverter, can drive a maximum capacitance of 158 fF in 65 nm CMOS. When using a 0.06 micron gate length, the largest total gate width respecting the maximum capacitive load is approximately 730 micron, which corresponds to a total W/L ratio of 12166. In other words, this W/L ratio is the maximum W/L ratio that can be driven by a single driver.

Figure 7:
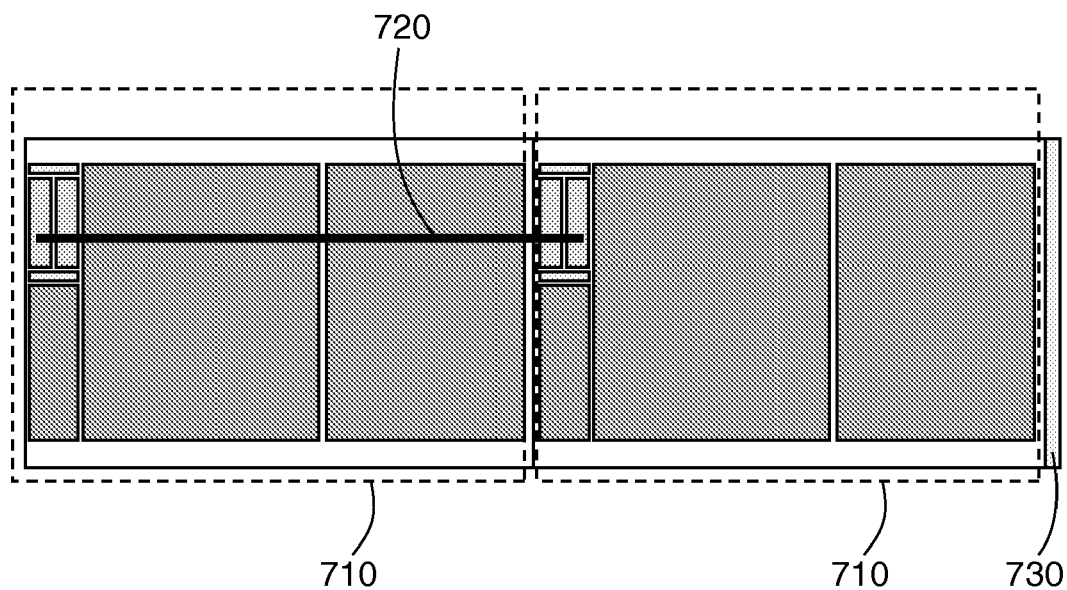
FIG. 7 shows a power switch block designed in accordance with an embodiment of the method of the present invention.

Hence, if the required W/L ratio exceeds this maximum, the power switch block must be divided into multiple segments. FIG. 7 shows an embodiment of a power switch block 200 comprising two segments 710, which may be interconnected via a segment connection 720 in the routing channel 310. Preferably, the segments 710 are substantially similar, i.e. comprise no or little design parameter variations between segments. In an embodiment, the total required W/L ratio is balanced between the different segments 710 to ensure equal latency between the segments. Optionally, the multi-segment power switch block 200 may comprise additional latch-up protection 730.

As has been mentioned previously, the optimal performance of the power switch block 200 is of essence since the purpose of such a block is to reduce the overall power consumption of the IC in which it is placed. Hence, it is important that the power switch block 200 consumes considerably less power than an idle IC core 100. Typical performance Figures related to the power consumption of the power switch block 200 include switch resistance, required area, latency, and W/L range. The switch resistance is dependent on the selected W/L ratio of the power switches 115, 135, which is constrained by the allowed or available switch area. Latency metrics are important if timing is strict or if the power switch block 200 is used in for instance a feedback loop system.

Figure 2:
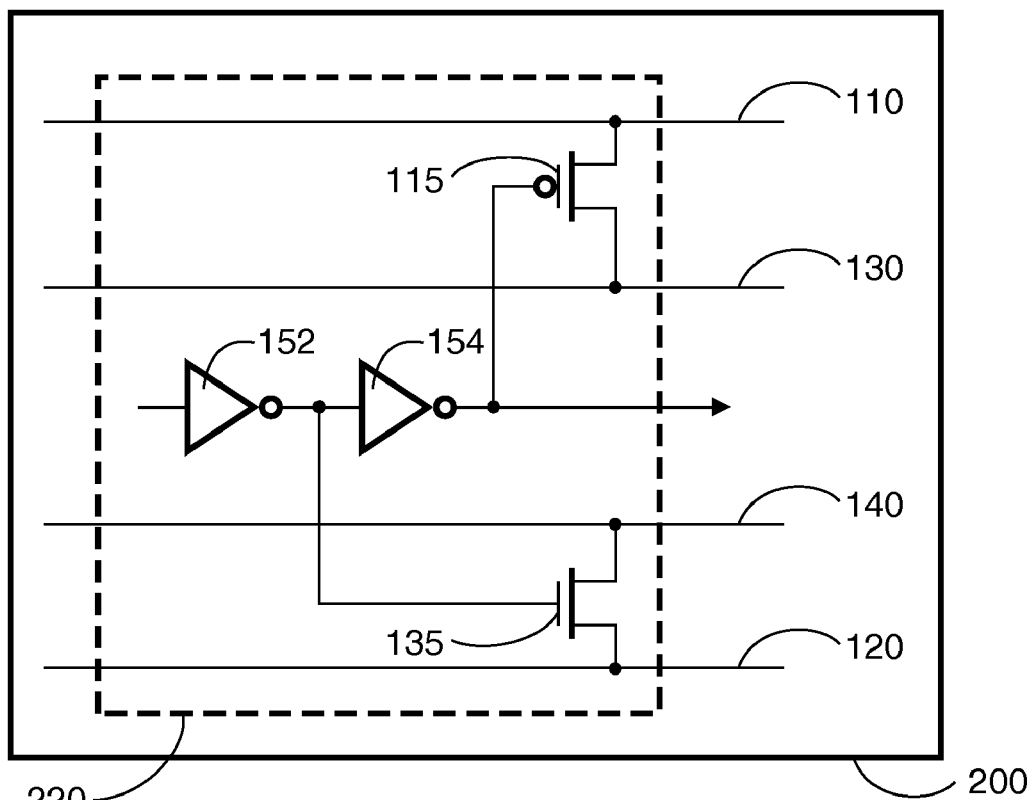
FIG. 2 shows a layout of a power switch block.
Figure 8:
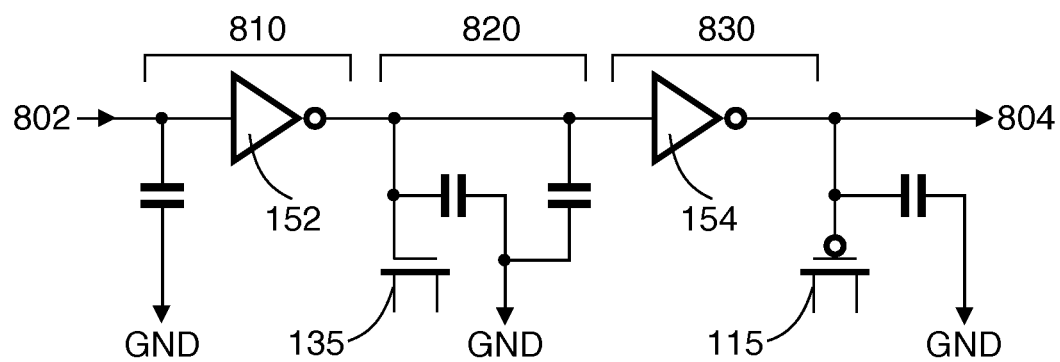
FIG. 8 shows another power switch block designed in accordance with an embodiment of the method of the present invention.

FIG. 8 depicts a model of the power switch block latency. For a power switch block 200 as shown in FIG. 2, three stages can be identified:

Stage 810: The latency from the input to the output of the first driver 152;
Stage 820: The latency of the connection between the first driver 152 and the second driver 154; and
Stage 830: The latency from the input to the output of the second driver 154.

The latency behavior of these stages is depicted in FIG. 8 by means of the accompanying capacitors at the input of the drivers 152, 154 and the respective gates of the nMOS switch 135 and the pMOS switch 115, with the latency being modeled by the time required to fully charge the respective capacitors. This corresponds to the delay from the input to the output of a corresponding stage. The delay is caused by the resistance shut by a capacitor which results in an RC network.

The resistance of the path between the input 802 and the output 804 can be estimated by:

$$R = R\frac{l}{w} \tag{3}$$

Where R is the resistance of the path, R is the sheet resistance, l is the length of the path, and w is the width of the path. The latency over a path with length l can be estimated by:

$$t' R_{line} C_{load} = R\frac{l}{w} C_{load} \tag{4}$$

Where $C_{load}$ is the capacitive load at the end of the path.

In this case, the capacitive load would be the input capacitance of the second driver since the nMOS transistor 135 is directly at the output of the first driver and hence does not add up for the path delay. The latency of the first and second driver 152, 154 can be estimated by values from the table of the driver datasheet provided with the library.

The total capacitive load of the first driver 152, e.g. a first inverter, is the sum of the capacitance of the nMOS transistor 135 from gate to ground and the capacitive load of the input of the second driver 154, e.g. a second inverter. The second stage 820 comprises the path delay for the connection between the first and second driver 152, 154. The line dimensions may be kept constant, e.g. a length of 0.6 μm with a width of 0.1 μm in CMOS065. The resistance of the line is $$R_{line} = R\frac{l}{w} = 0.21974\frac{0.6}{0.1} = 1.318\Omega \tag{5}$$

The load of the third stage 830 comprises the capacitive input load of the second driver 154. Hence, the maximum delay may be expressed as:

$$tR_{line}C_{load} = 1.318 \cdot 2.48 fF = 3.268 fs \tag{6}$$

This delay is negligible compared to the driver delay since it is several orders of magnitude smaller. The delay of the second driver 154 can be calculated in a similar fashion as to the first driver 152. A minimum and a maximum total latency scenario is calculated for a number of CMOS 065 inverters. The results are listed in Table 1, together with the corresponding calculated W/L ratios of the NMOS transistor 135 (shown in brackets) and the PMOS transistor 115, the corresponding capacitive load, and the corresponding total leakage of the power switch block 200.

TABLE 1

| Inverter type | Inverter load (fF) | | Switch W/L ratio | | Total Delay (ps) | | Switch Leakage (pA) | |
|---|---|---|---|---|---|---|---|---|
| | min | max | min (N) P | max (N) P | min | max | min | max |
| HS65_L H_IVX2 | 1.09 | 46.3 | (86.3) 60.9 | (3666) 3333 | 60 | 1190 | 5.68 | 278 |
| HS65_L H_IVX4 | 46.3 | 83.4 | (3666) 3333 | (6666) 6333 | 700 | 1210 | 278 | 517 |
| HS65_L | 83.4 | 120 | (6666) | (9666) | 860 | 1220 | 517 | 749 |

TABLE 1-continued

| Inverter type | Inverter load (fF) | | Switch W/L ratio | | Total Delay (ps) | | Switch Leakage (pA) | |
|---|---|---|---|---|---|---|---|---|
| | min | max | min (N) P | max (N) P | min | max | min | max |
| H_IVX7 HS65_L H_IVX9 | 120 | 158 | 6333 (9666) 9166 | 9166 (−) 12166 | 960 | 1250 | 749 | 1037 |

As has been explained previously, when the required W/L ratio of a transistor causes the threshold of the maximum capacitive load of the available drivers to be exceeded, the power switch block 200 is split up in multiple segments 710. The segments 710 are linked by connecting the output of the first segment 710 to the input of the second segment 710 via connection 720. This connection ensures that the logic levels between the drivers of the various segments are maintained. The total delay of a power switch block 200 comprising multiple segments 710 can be approximated by:

$$t_{multiple.segments} = t_{one.segment} \#segments + t'_{line}(\#segments-1) \quad (7)$$

In an example embodiment in CMOS065, the connection 720 between two segments 710 is 0.13 µm in width and a maximum 42 µm in length. This results in a maximum delay of:

$$t'_{line} R \frac{l}{w} C_{load} = 201.92 \cdot 10^{-3} \frac{42}{0.13} 2.48 \cdot 10^{-15} = 161.79 fs \quad (8)$$

The method of the present invention may be automated by implementing the various steps of the method in a computer program for designing an IC. Since such an implementation falls within the routine skills of the skilled practitioners, such an implementation will not be discussed in further detail for reasons of brevity only. Such a computer program product may be made available on any suitable computer-readable data carrier such as a CD-ROM, DVD, memory stick, and so on. The computer-readable data carrier may also comprise a storage device accessible through a network such as the internet.

Figure 9:
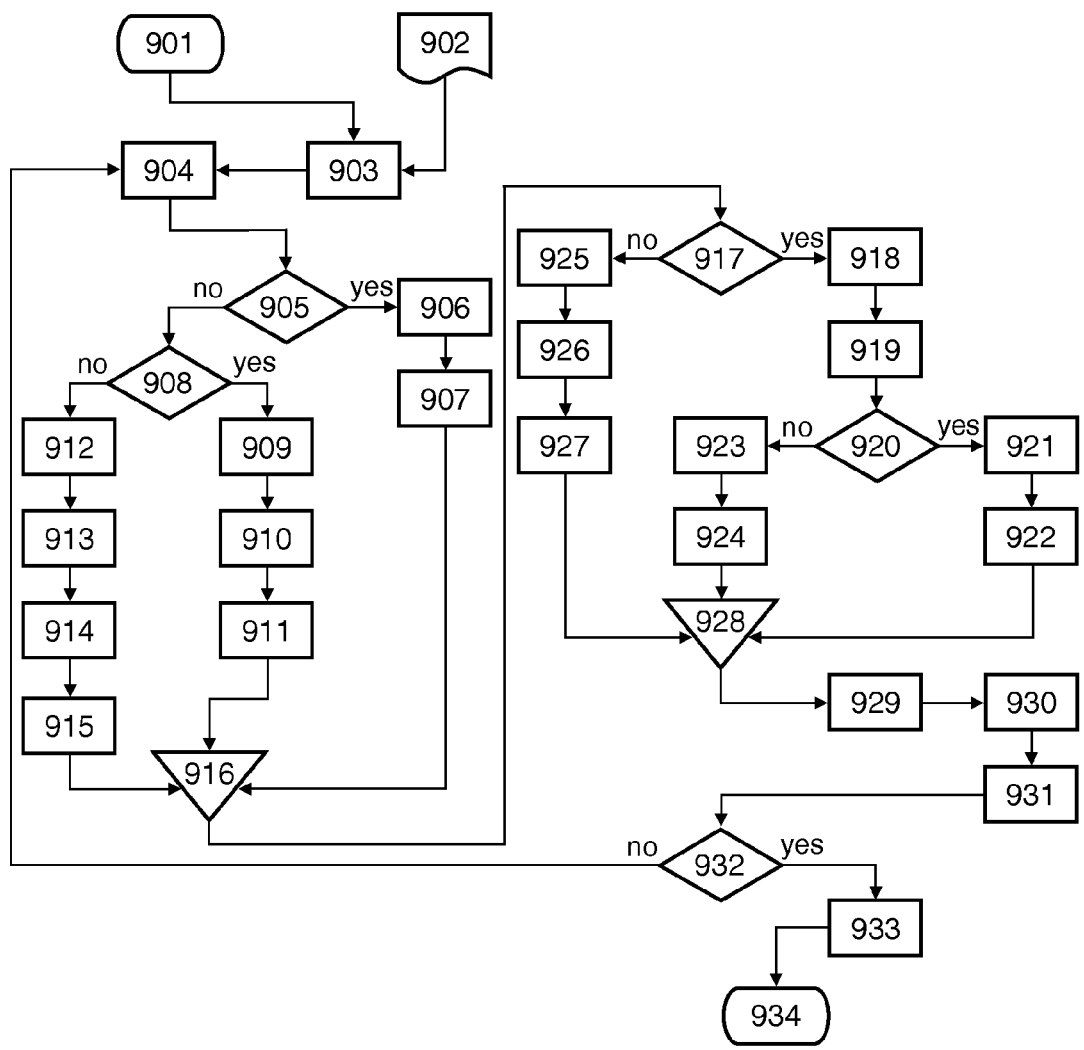
FIG. 9 shows a multiple segment layout of a power switch block designed in accordance with an embodiment of the method of the present invention.

FIG. 9 shows a flowchart of an aspect of an embodiment of the method of the present invention. In step 901, a layout script of a power switch block 200 in a predefined technology is provided. This script may be included in a larger script file, e.g. a script of the IC layout. In step 902, a performance requirements file is provided, which typically specifies the required W/L ratios of the various switches of the power switch block 200 in the aforementioned layout script. The performance requirements file may be generated manually by the IC designer. Alternatively, as will be explained in more detail later, this file may be generated automatically.

In step 903, the required W/L ratios of the pMOS switch 115 and the nMOS switch 135 are loaded into the memory accessible to the computer program executing the method of the present invention. In step 904, it is determined how many segments 710 are required to achieve the required W/L ratios. Next, the method proceeds to optimizing the layout of the individual switches in the one or more segments.

In step 905, it is decided if the maximum achievable W/L ratio of the small pMOS transistor 115 is large enough to provide the required W/L ratio. If this is the case, the method proceeds to step 906 in which the number of fingers of the small pMOS transistor 115 is determined, after which the gate length of the small pMOS transistor 115 is determined based on a simulated initial value received from the performance requirements file. The values determined in steps 906 and 907 are rounded off in step 916 such that they correspond to the grid size of the predetermined technology.

If it is decided in step 905 that a large pMOS transistor 115' is required, the method proceeds to step 908 in which it is determined if the difference between the maximum achievable W/L ratio of the small pMOS transistor 115 and the required W/L ratio is smaller than a predefined threshold.

If this is the case, the method proceeds to step 909 in which the number of fingers of the small pMOS transistor 115 is set to one less than the maximum number of fingers achievable in the technology and the large pMOS transistor 115' is set to have a single finger for reasons previously explained. In step 910, the gate lengths of the small pMOS transistor 115 and the large pMOS transistor 115' are set to their minimum allowed values in the given technology, after which the gate width of the large pMOS transistor 115' is set to the product of the difference between the required W/L ratio and the actual W/L ratio of the small pMOS transistor 115 and the minimum allowable gate length of the large pMOS transistor 115' in step 911, after which the calculated values are rounded off to fit the technology grid size in step 916.

If the difference between the maximum achievable W/L ratio of the small pMOS transistor 115 and the required W/L ratio is larger than a predefined threshold, the method proceeds to step 912 in which the number of fingers of the small pMOS transistor 115 is set to the maximum number of fingers allowable in its available area. In step 913, the gate lengths of the small pMOS transistor 115 and the large pMOS transistor 115' are set to their minimum allowed values in the given technology. Next, the number of fingers required for the large pMOS transistor 115' is calculated in step 914 by dividing the difference between the required W/L ratio and the actual W/L ratio of the small pMOS transistor 115 by the maximum W/L ratio of a single finger of the large pMOS transistor 115'.

Next, the gate width of the large pMOS transistor 115' is set to the product of the difference between the required W/L ratio and the actual W/L ratio of the small pMOS transistor 115 and the minimum allowable gate length of the large pMOS transistor 115' in step 915, after which the calculated values are rounded off to fit the technology grid size in step 916.

The method subsequently proceeds to optimize the layout of the nMOS transistor 135. In step 917, it is decided if the required W/L ratio of the nMOS transistor 135 can be achieved by the largest number of fingers for which a larger lower bound predefined gate width can be used within the constraints of the given technology. If this is the case, the method proceeds to step 918 in which the gate width of the nMOS transistor 135 is set to the larger lower bound predefined gate width, e.g. 0.065 µm for a maximum of four fingers in CMOS 065. In step 919, the actual number of fingers of the nMOS transistor 135 is determined by dividing the maximum allowable gate width by the minimum allowable gate length.

Subsequently, it is decided in step 920 if the W/L ratio of the nMOS transistor 135 is smaller than the determined number of fingers multiplied by the fraction defined in step 919. If this is the case, the gate width of the nMOS transistor 135 is set to the minimum allowed value in step 921 and the gate length is optimized based on the performance requirements specified in the performance requirements file. Otherwise, the method proceeds to step 923 in which the gate width of the nMOS transistor 135 is optimized in accordance with its performance requirements, and the gate length is set to the minimum allowable dimension in the given technology in step 924. The calculated gate dimensions of the nMOS transistor 135 are subsequently rounded off to fit the technology grid size in step 928.

In case it is decided in step 917 that the required W/L ratio of the nMOS transistor 135 cannot be achieved by the largest number of fingers for which a larger lower bound predefined gate width can be used within the constraints of the given technology, the minimum gate length is set in step 925 to a smaller predefined value, e.g. 0.06 μm for a minimum of five fingers in CMOS 065. The required number of fingers is determined in step 926 by dividing the maximum allowable gate width by the minimum allowable gate length, after which the gate width is optimized in step 927 by dividing the required W/L ratio by the determined number of fingers and the minimum allowable gate length. Subsequently, the obtained parameters of the nMOS transistor 135 are rounded off to fit the technology grid size in step 928.

In step 929, the suitable drivers are selected from the standard technology library, thereby ensuring that the capacities of the selected drivers are sufficient to meet the load requirements of the power switches as defined by their respective required W/L ratios. In step 930, the various connections between the components of the power supply block 200 and the power grid lines are placed, after which the length of the power switch block control line 150 is rounded off to fit the place and route grid in step 931.

Next, it is decided in step 932 if further power supply blocks 200 require optimizing. If this is the case, the method reverts back to step 904. Otherwise, the method proceeds to step 933 in which the IC design is further processed, e.g. by the placement of the power lines and the power pins, after which the method terminates in step 934 by providing a completed IC layout script.

Figure 10:
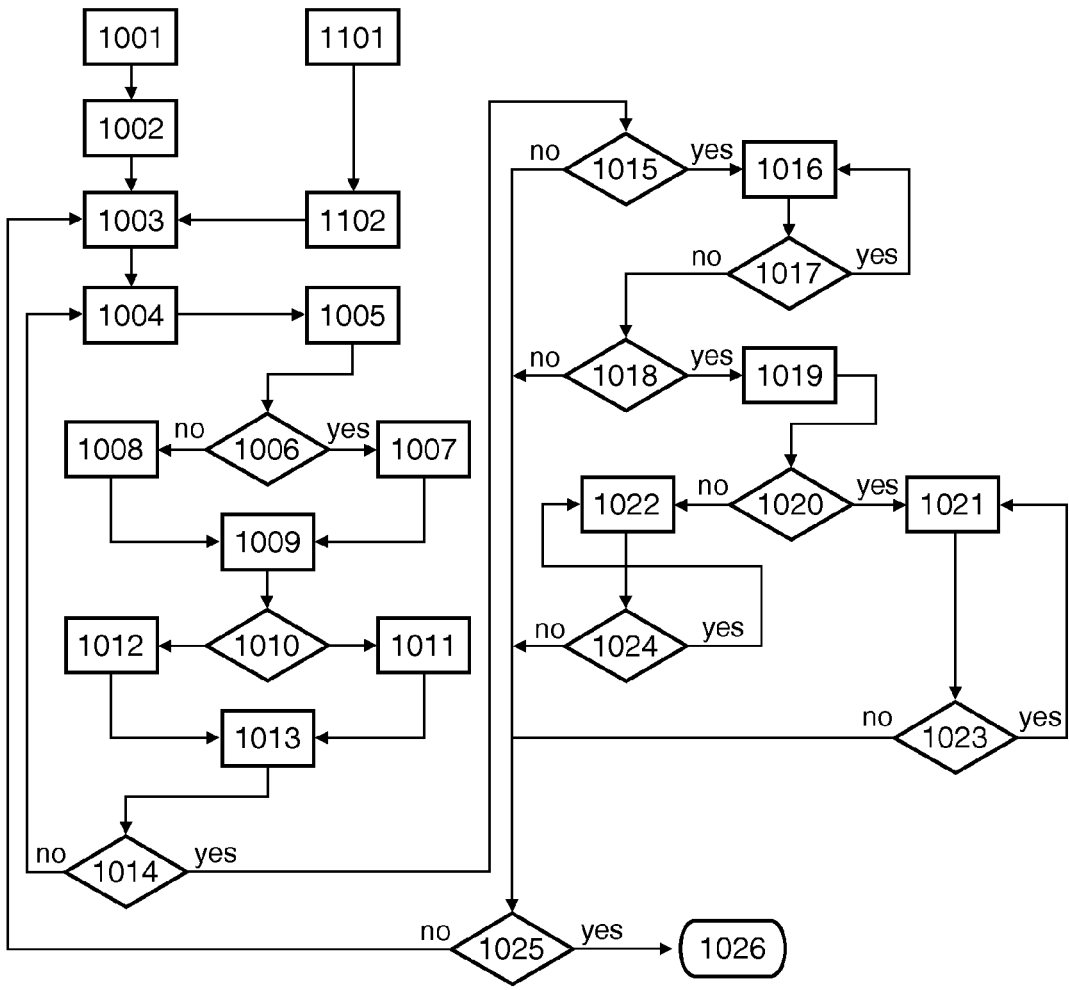
FIG. 10 shows a latency model of a power switch block.

In an embodiment, the performance requirements script specifying the required W/L ratios of the various switches 115, 115' and 135 may also be generated in an automated fashion. A flowchart of a method to automatically generate this script is shown in FIG. 10. In step 1001, an approximation model is provided to approximate the behavior of the pMOS switches 115, 115' and the nMOS switch 135. The simulator parameters for the simulation of the behavior of the respective transistors are set in step 1002.

In step 1101, the required resistances of the respective power switches are provided, and a list of the required resistances for the respective power switches in a power switch block 200 is generated in step 1102. It is noted that at this stage, the power switch is handled as an abstract functional unit, for which it is unknown by how many transistors and/or segments the switch will be implemented. This list is used in step 1003 to select the next power switch block 200 for which the behavior is to be simulated.

The method subsequently proceeds to step 1004, in which a simulation step size is defined, after which the simulation is initiated in step 1005. The step size is a scaling factor for the transistor dimensions. In a first step 1006, the drain voltage of the pMOS power switch 115 is simulated and compared with the nominal supply voltage $V_{DD}$. If the drain voltage of the pMOS power switch 115 is larger than $V_{DD}/2$, the new gate width of the pMOS power switch 115 is set to the product of the step size and the old gate width of the pMOS power switch 115 in step 1007. If the drain voltage of the pMOS power switch 115 is smaller than $V_{DD}/2$, the new gate width of the pMOS power switch 115 is set to the old gate width of the pMOS power switch 115 divided by the step size in step 1008. In step 1010, it is checked of the adjusted pMOS power switch 115 has a drain voltage that deviates less than a predefined amount, e.g. 0.1%, from $V_{DD}/2$, after which the pMOS power switch 115 is labeled 'finished' if this is the case.

The same procedure is subsequently repeated for the nMOS power switch 135. In a first step 1010, the drain voltage of the nMOS power switch 135 is simulated and compared with the nominal supply voltage $V_{DD}$. If the drain voltage of the nMOS power switch 135 is larger than $V_{DD}/2$, the new gate width of the nMOS power switch 135 is set to the product of the step size and the old gate width of the nMOS power switch 135 in step 1011. If the drain voltage of the nMOS power switch 135 is smaller than $V_{DD}/2$, the new gate width of the nMOS power switch 135 is set to the old gate width of the nMOS power switch 135 divided by the step size in step 1012. In step 1010, it is checked of the adjusted nMOS power switch 135 has a drain voltage that deviates less than a predefined amount, e.g. 0.1%, from $V_{DD}/2$, after which the nMOS power switch 135 is labeled 'finished' if this is the case.

In step 1014, it is checked if both the pMOS power switch 115 and the nMOS power switch 135 are finished. If not, the method reverts back to step 1004, in which a smaller step size is defined, after which the simulation is run again. Otherwise, the method proceeds to step 1015, in which it is checked if the maximum possible W/L ratio of the small pMOS transistor 115 is smaller than the required W/L ratio, as calculated in the simulation. If this is the case, the method will proceed to step 1016 in which the number of fingers required for the small pMOS transistor 115 is calculated and its gate length is estimated. Nexty, in step 1017, it is checked if the same estimation is required for the large pMOS transistor 115', which, if this is the case, causes the method to revert back to step 1016.

If not, the method will proceed to step 1018, in which it is determined if the required W/L ratio of the nMOS power switch 135 can be achieved by the maximum number of fingers for which a larger minimum gate width can be used in the given technology. If this is the case, the method proceeds to step 1019 in which the required number of fingers is calculated. Next, in step 1020, it is decided if the required W/L ratio of the nMOS power switch 135 is smaller than the product of the calculated number of fingers and the minimum allowable gate width. If this is indeed the case, the required gate length of the nMOS power switch 135 is estimated in step 1021; otherwise, the required gate width of the nMOS power switch 135 is estimated in step 1023 for a minimum allowable gate length in the given technology.

From steps 1021 and 1023, it is checked, in respective steps 1022 and 1024 if a further estimation is required for the nMOS power switch 135. This is necessary because any adjustment to the gate length requires a new simulation of the transistor resistance because its resistance does not linearly scale with its gate length. If this is the case, the method reverts back to steps 1021 or 1023; otherwise, the method proceeds to step 1025 in which it is checked if all required W/L ratios are calculated for the specified required resistances. If this is not the case, the method returns to step 1003; otherwise, the method terminates in step 1026 in which the approximated required W/L ratios of the various power supply blocks 200 are provided.

It is pointed out if it is decided in step 1015, that the maximum possible W/L ratio of the small pMOS transistor 115 is not smaller than the required W/L ratio, no further estimation is required, and the method may proceed to step 1025. Similarly, if it is decided in step 1018 that the required W/L ratio of the nMOS power switch 135 cannot be achieved by the maximum number of fingers for which a larger minimum gate width can be used in the given technology, no further estimation is required, and the method may also proceed to step 1025.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A non-transitory computer-readable medium that stores computer code arranged to, when executed on a computer, implement a method of designing a power switch block for an integrated circuit layout in a predefined integrated circuit technology, the power switch block including a segment having a plurality of spaced parallel conductors each having a predefined height in said technology, a stack of a first power switch of a first conductivity type and a pair of drivers for respectively driving the first power switch and a second power switch, said drivers having predefined dimensions in said technology including a predefined driver height and a predefined driver width, and the second power switch of a second conductivity type, the method comprising:
    providing respective predefined width/length ratios for said power switches;
    determining a total height of the segment from the sum of the predefined heights of the spaced parallel conductors and respective spacings between said spaced parallel conductors,
    determining the height of a first transistor from the difference between a total height and the predefined driver height;
    determining a width of the first transistor from the combined predefined widths of the pair of drivers;
    optimizing the first power switch layout within its determined height and width based on its predefined width/length ratio; and
    optimizing the second power switch layout based on its predefined width/height ratio.

2. The non-transitory computer-readable medium according to claim 1, wherein the step of optimizing the first power switch layout comprises optimizing at least one of a gate length and a number of fingers of the first power switch such that a difference between the optimized width/length ratio of the first power switch and the predefined width/length ratio is minimized.

3. The non-transitory computer-readable medium according to claim 1, further comprising:
    comparing the optimized width/length ratio of the first power switch with the predefined width/length ratio, and in the case that the optimized width/length ratio of the first power switch is smaller than the predefined width/length ratio,
    adding a further power switch of the first conductivity type to the segment, said further power switch having a width/length ratio such that a difference between the effective width/length ratio of the combined first and further power switches and the predefined width/length ratio is minimized.

4. The non-transitory computer-readable medium according to claim 3, wherein the further power switch is placed between the first power switch and the second power switch.

5. The non-transitory computer-readable medium according to claim 3, wherein the difference between effective width/height ratio and the predefined width/height ratio is minimized by optimizing at least one of the gate width and the number of fingers of the further power switch.

6. The non-transitory computer-readable medium according to claim 3, wherein the step of optimizing the first power switch layout comprises defining the number of fingers of the first power switch to one less than the maximum number of fingers available for the first power switch in the predefined integrated circuit technology in the case that the predefined width/length ratio of the first power switch exceeds the maximum possible width/length ratio of the first power switch by less than a predefined amount.

7. The non-transitory computer-readable medium according to claim 1, wherein the step of optimizing the second power switch layout comprises optimizing at least one of the gate length, gate width and the number of fingers of the second power switch.

8. The non-transitory computer-readable medium according to claim 1, further comprising:
    providing a library of components in the predefined integrated circuit technology, said library including a plurality of drivers having different capacitive driving capabilities; and
    selecting the pair of drivers from said library based on the respective loads of the first power switch and the second power switch.

9. The non-transitory computer-readable medium according to claim 8, further comprising:
    finding, in said library, the driver having the highest capacitive driving capacity;
    comparing said driving capacity with a load of a corresponding power switch; and, in the case that the load exceeds said driving capacity,
    adding a further segment to the power switch block; and
    dividing said load over said segments.

10. The non-transitory computer-readable medium according to claim 8, wherein said load is derived from a corresponding predefined width/length ratio.

11. The non-transitory computer-readable medium according to claim 1, wherein the respective first and second power switch layouts are optimized in terms of area utilization.

12. The non-transitory computer-readable medium according to claim 1, wherein the stack further comprises a pair of latch-up protection areas having a predetermined height, and wherein the step of determining the height of the first transistor comprises determining the height of the first transistor from the difference between the total height and a sum of the predefined driver height and combined predetermined heights of latch-up protection areas.

13. The non-transitory computer-readable medium according to claim 1, further comprising calculating the predefined width/length ratios from the desired respective resistances of said first and second power switches.

14. A non-transitory computer-readable medium that stores computer code arranged to, when executed on a computer, implement a method of generating an IC layout script using a library of components in a predefined integrated circuit technology, said library including a plurality of drivers having different capacitive driving capabilities and having predefined dimensions in said technology including a predefined driver height and a predefined driver width, the IC layout script comprising a power switch block including a segment comprising a plurality of spaced parallel conductors each having a predefined height in said technology, a stack of a first power switch of a first conductivity type and a pair of said drivers for respectively driving the first power switch and a second power switch of a second conductivity type, the method comprising:
 selecting the pair of drivers from said library based on the respective loads of the first power switch and the second power switch; and
 designing the layout of the first and second power switches of the power switch block on the fly by:
 providing respective predefined width/length ratios for said power switches;
 determining a total height of the segment from a sum of the predefined heights of the spaced parallel conductors and respective spacings between said spaced parallel conductors,
 determining a height of the first transistor from a difference between the total height and the predefined driver height;
 determining a width of the first transistor from the combined predefined widths of the pair of drivers;
 optimizing the first power switch layout within its determined height and width based on its predefined width/length ratio; and
 optimizing the second power switch layout based on its predefined width/height ratio.

15. The non-transitory computer-readable medium according to claim 14, wherein the step of optimizing the first power switch layout comprises optimizing at least one of the gate length and the number of fingers of the first power switch such that a difference between the optimized width/length ratio of the first power switch and the predefined width/length ratio is minimized.

16. The non-transitory computer-readable medium according to claim 14, further comprising:
 comparing the optimized width/length ratio of the first power switch with the predefined width/length ratio, and in the case that the optimized width/length ratio of the first power switch is smaller than the predefined width/length ratio,
 adding a further power switch of the first conductivity type to the segment, said further power switch having a width/length ratio such that a difference between the effective width/length ratio of the combined first and further power switches and the predefined width/length ratio is minimized.

17. The non-transitory computer-readable medium according to claim 16, wherein the further power switch is placed between the first power switch and the second power switch.

18. The non-transitory computer-readable medium according to claim 16, wherein the difference between effective width/height ratio and the predefined width/height ratio is minimized by optimizing at least one of the gate width and the number of fingers of the further power switch.

19. The non-transitory computer-readable medium according to claim 14, wherein the step of optimizing the second power switch layout comprises optimizing at least one of the gate length, gate width and the number of fingers of the second power switch.

20. The non-transitory computer-readable medium according to claim 14, further comprising:
 finding, in said library, the driver having the highest capacitive driving capacity;
 comparing said driving capacity with a load of a corresponding power switch; and, in the case that the load exceeds said driving capacity,
 adding a further segment to the power switch block; and
 dividing said load over said segments.

* * * * *